US010483429B2

United States Patent
Masuko

(10) Patent No.: US 10,483,429 B2
(45) Date of Patent: Nov. 19, 2019

(54) METHOD OF MANUFACTURING SOLAR CELL

(71) Applicant: Panasonic Intellectual Property Management Co., Ltd., Osaka (JP)

(72) Inventor: Keiichiro Masuko, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 15/713,586

(22) Filed: Sep. 22, 2017

(65) Prior Publication Data

US 2018/0019368 A1 Jan. 18, 2018

Related U.S. Application Data

(63) Continuation of application No. PCT/JP2016/000939, filed on Feb. 23, 2016.

(30) Foreign Application Priority Data

Mar. 24, 2015 (JP) .................. 2015-061278

(51) Int. Cl.
*H01L 21/00* (2006.01)
*H01L 31/20* (2006.01)
(Continued)

(52) U.S. Cl.
CPC ...... *H01L 31/202* (2013.01); *H01L 31/02167* (2013.01); *H01L 31/022441* (2013.01);
(Continued)

(58) Field of Classification Search
CPC .......... H01L 31/202; H01L 31/022441; H01L 31/0747; H01L 31/02167; H01L 31/03762; H01L 31/02168
(Continued)

(56) References Cited

U.S. PATENT DOCUMENTS 8,552,520 B2 * 10/2013 Jin .................... H01L 31/02168
136/252
9,537,043 B2 1/2017 Yamazaki et al.
(Continued)

FOREIGN PATENT DOCUMENTS

JP 2010-157614 A 7/2010
JP 2013-026269 A 2/2013
(Continued)

OTHER PUBLICATIONS

Search Report issued in corresponding International Patent Application No. PCT/JP2016/000939, dated Apr. 19, 2016.

*Primary Examiner* — Vu A Vu
(74) *Attorney, Agent, or Firm* — McDermott Will & Emery LLP

(57) ABSTRACT

A method of manufacturing a solar cell includes: providing an insulating layer on a semiconductor layer provided on at least a part of a principle surface of a semiconductor substrate; providing a mask layer on the insulating layer; removing a part of the mask layer by laser irradiation so as to form a first opening through which the insulating layer is exposed; and removing, by an etching agent, the insulating layer exposed through the first opening so as to form a second opening through which the semiconductor layer is exposed.

17 Claims, 8 Drawing Sheets

(51) Int. Cl.
    *H01L 31/0747*    (2012.01)
    *H01L 31/0216*    (2014.01)
    *H01L 31/0224*    (2006.01)
    *H01L 31/0376*    (2006.01)

(52) U.S. Cl.
    CPC .... *H01L 31/03762* (2013.01); *H01L 31/0747* (2013.01); *H01L 31/02168* (2013.01); *Y02E 10/50* (2013.01)

(58) Field of Classification Search
    USPC .......................................................... 438/96
    See application file for complete search history.

(56) References Cited

U.S. PATENT DOCUMENTS

| | | |
|---|---|---|
| 2010/0071765 A1 | 3/2010 | Cousins et al. |
| 2011/0259420 A1 | 10/2011 | Yamazaki et al. |
| 2013/0288423 A1* | 10/2013 | Takahama ....... H01L 31/022441 438/96 |
| 2014/0096821 A1* | 4/2014 | Chen ................... H01L 31/0352 136/256 |
| 2014/0373919 A1 | 12/2014 | Desrues et al. |
| 2015/0007879 A1 | 1/2015 | Kwon et al. |

FOREIGN PATENT DOCUMENTS

| | | |
|---|---|---|
| JP | 2013-187388 A | 9/2013 |
| JP | 2014-110256 A | 6/2014 |
| WO | 2012/090643 A1 | 7/2012 |

\* cited by examiner

METHOD OF MANUFACTURING SOLAR CELL

RELATED APPLICATION

Priority is claimed to Japanese Patent Application No. 2015-061278, filed on Mar. 24, 2015, the entire content of which is incorporated herein by reference.

BACKGROUND OF THE INVENTION

1. Field of the Invention

The present invention relates to a method of manufacturing a solar cell and particularly to a method of manufacturing a back surface junction type solar cell.

2. Description of the Related Art

Solar cells having high power generation efficiency include back surface junction type solar cells with an n-type semiconductor layer and a p-type semiconductor layer formed on a back surface thereof, which is opposite to a light-receiving surface on which light becomes incident. Between the n-type semiconductor layer and the p-type semiconductor layer, an insulating layer is provided that insulates the layers from each other. These semiconductor and insulating layers are patterned by etching using a mask for photoresist or the like.

SUMMARY OF THE INVENTION

Solar cells are desirably manufactured by a method with lowered running costs.

In this background, a purpose of the present invention is to provide a method of manufacturing solar cells with lowered costs.

A method of manufacturing a solar cell according to one embodiment of the present invention includes: providing an insulating layer on a semiconductor layer provided on at least a part of a principle surface of a semiconductor substrate; providing a mask layer on the insulating layer; removing a part of the mask layer by laser irradiation so as to form a first opening through which the insulating layer is exposed; and removing, by an etching agent, the insulating layer exposed through the first opening so as to form a second opening through which the semiconductor layer is exposed.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION

Figure 1:
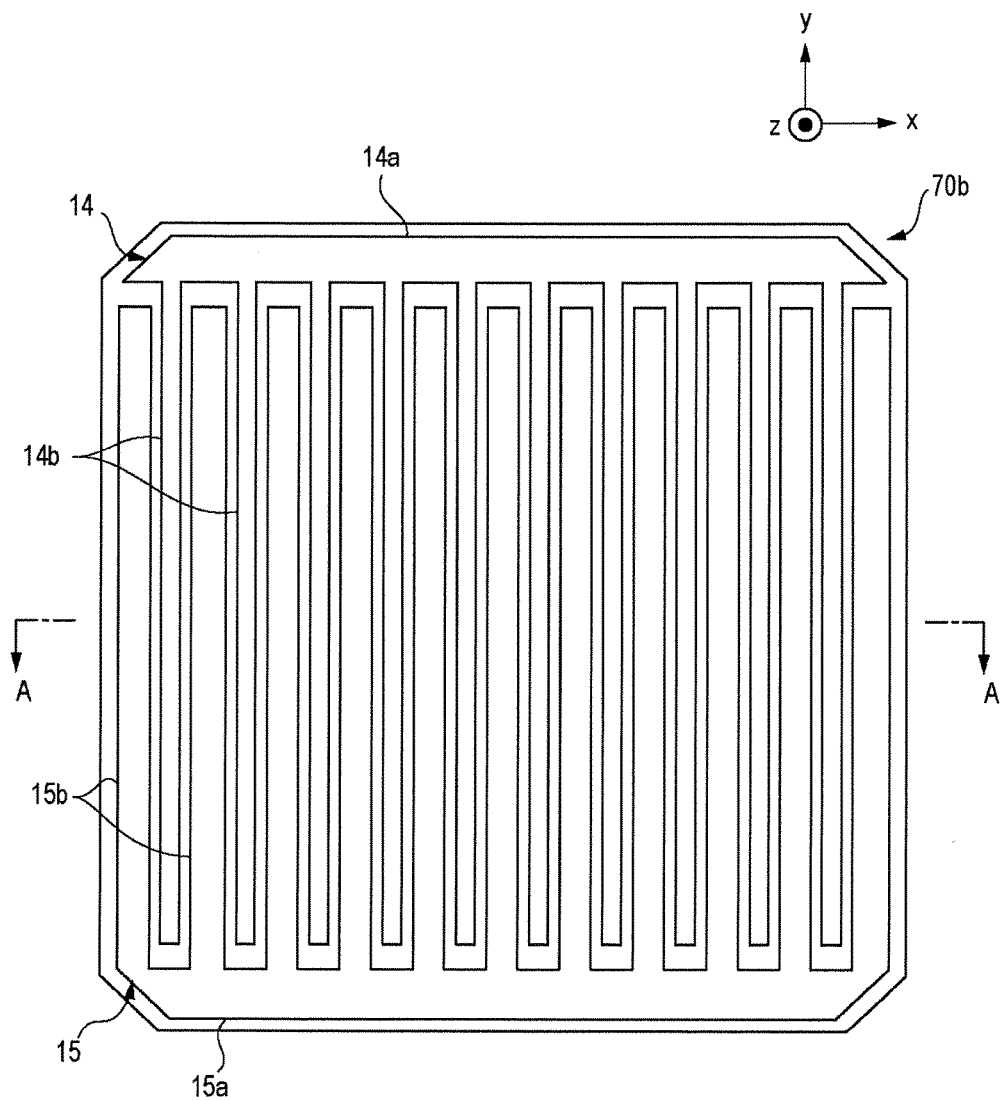
FIG. 1 is a plan view illustrating a solar cell according to an embodiment.

The invention will now be described by reference to the preferred embodiments. This does not intend to limit the scope of the present invention, but to exemplify the invention.

A brief description is now given before focusing on specific features of the present invention. An embodiment of the present invention relates to a method of manufacturing a solar cell. The method includes: providing an insulating layer on a semiconductor layer provided on at least a part of a principle surface of a semiconductor substrate; providing a mask layer on the insulating layer; removing a part of the mask layer by laser irradiation so as to form a first opening through which the insulating layer is exposed; and removing, by an etching agent, the insulating layer exposed through the first opening so as to form a second opening through which the semiconductor layer is exposed. According to the present embodiment, since a mask layer is patterned by laser, patterns of an insulating layer and a semiconductor layer can be formed by patterning the mask layer without using a photolithography process. This allows a high cost photolithography process to be removed, thereby allowing the manufacturing cost of a solar cell to be lowered.

Hereinafter, an embodiment for carrying out the present invention will be described in detail with reference to the accompanying drawing. In the explanations of the figures, the same elements shall be denoted by the same reference numerals, and duplicative explanations will be omitted appropriately.

FIG. 1 is a plan view illustrating a solar cell 70 according to the embodiment and illustrates the structure of a back surface 70b of the solar cell 70. The solar cell 70 is provided with an n-side electrode 14 and a p-side electrode 15, which are provided on the back surface 70b. The n-side electrode 14 is formed in a comb-tooth shape including a bus bar electrode 14a extending in an x direction and a plurality of finger electrodes 14b extending in a y direction. In the same way, the p-side electrode 15 is formed in a comb-tooth shape including a bus bar electrode 15a extending in the x direction and a plurality of finger electrodes 15b extending in the y direction. The n-side electrode 14 and the p-side electrode 15 are formed such that the respective comb teeth engage with each other and are inserted into each other. Each of the n-side electrode 14 and the p-side electrode 15 may be formed only with a plurality of finger electrodes and may be a bus bar-less type electrode that does not have a bus bar.

Figure 2:
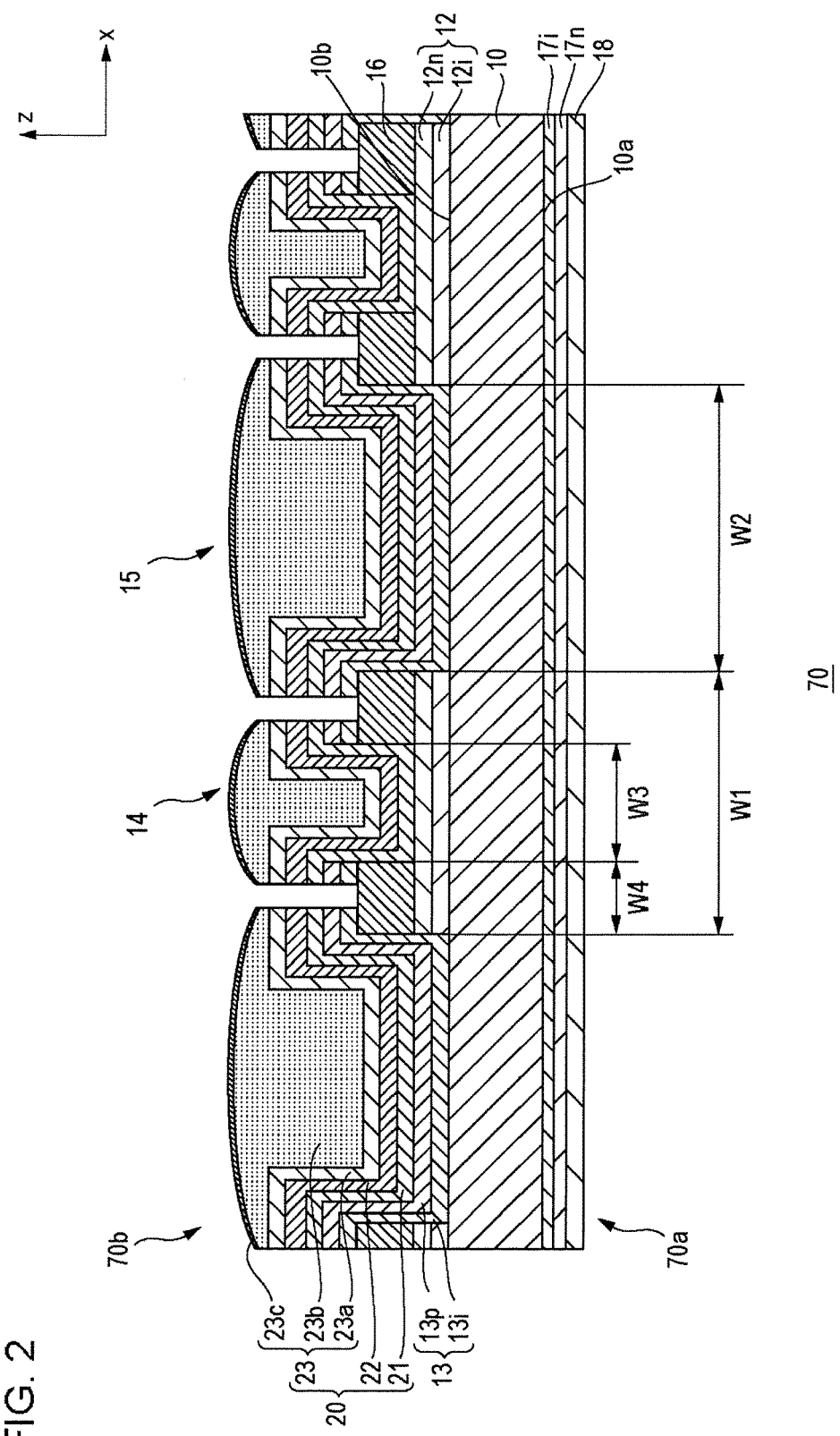
FIG. 2 is a cross-sectional view illustrating the structure of a solar cell according to the embodiment.

FIG. 2 is a cross-sectional view illustrating the structure of the solar cell 70 according to the embodiment and illustrates an A-A line section in FIG. 1. The solar cell 70 is provided with a semiconductor substrate 10, a first i-type layer 12i, a first conductivity type layer 12n, a second i-type layer 13i, a second conductivity type layer 13p, a first insulating layer 16, a third i-type layer 17i, a third conductivity type layer 17n, a second insulating layer 18, and an electrode layer 19. The electrode layer 19 forms the n-side electrode 14 or the p-side electrode 15. The solar cell 70 is a back surface junction type photovoltaic device where the first conductivity type layer 12n and the second conductivity type layer 13p are provided on the side of the back surface 70b.

The semiconductor substrate 10 has a first principle surface 10a provided on the side of a light-receiving surface 70a and a second principle surface 10b provided on the side of the back surface 70b. The semiconductor substrate 10 absorbs light that becomes incident on the first principle surface 10a and generates electrons and positive holes as carriers. The semiconductor substrate 10 is formed of a crystalline semiconductor material of n-type or p-type conductivity. The semiconductor substrate 10 in the present embodiment is an n-type monocrystalline silicon substrate.

The light-receiving surface 70a means a principal surface on which light (sunlight) mainly becomes incident in the solar cell 70 and, specifically, means a surface on which the major portion of light entering the solar cell 70 becomes incident. On the other hand, the back surface 70b means the other principal surface opposite to the light-receiving surface 70a.

A first stack 12 and a second stack 13 are formed on the second principle surface 10b of the semiconductor substrate 10. The first stack 12 and the second stack 13 are formed in a comb-tooth shape so as to correspond to the n-side electrode 14 and the p-side electrode 15, respectively, and so as to be inserted into each other. Therefore, a first region W1 in which the first stack 12 is provided and a second region W2 in which the second stack 13 is provided are arrayed alternately in the x direction on the second principle surface 10b. Further, the first stack 12 and the second stack 13 that are adjacent to each other in the x direction are provided being in contact with each other. Therefore, in the present embodiment, the entirety of the second principle surface 10b is substantially covered by the first stack 12 and the second stack 13.

The first stack 12 is formed of the first i-type layer 12i formed on the second principle surface 10b and the first conductivity type layer 12n formed on the first i-type layer 12i. The first i-type layer 12i is formed of a substantially intrinsic amorphous semiconductor (hereinafter, an intrinsic semiconductor is also referred to as "i-type layer"). In the present embodiment, it is assumed that an "amorphous semiconductor" includes a microcrystalline semiconductor. A microcrystalline semiconductor is a semiconductor where semiconductor crystals are deposited in an amorphous semiconductor.

The first i-type layer 12i is formed of i-type amorphous silicon containing hydrogen (H) and has a thickness of, for example, about several nm to 25 nm. A method of forming the first i-type layer 12i is not particularly limited. For example, the first i-type layer 12i can be formed by a chemical vapor deposition (CVD) method such as a plasma CVD method.

The first conductivity type layer 12n is formed of an amorphous semiconductor to which an n-type dopant has been added whose conductivity type is the same as that of the semiconductor substrate 10. The first conductivity type layer 12n in the present embodiment is formed of n-type amorphous silicon containing hydrogen. The first conductivity type layer 12n has a thickness of, for example, about 2 nm to 50 nm.

The first insulating layer 16 is formed on the first stack 12. The first insulating layer 16 is not provided in a third region W3, which corresponds to the central portion of the first region W1 in the x direction, and is provided in a fourth region W4, which corresponds to the ends outside the third region W3. The width of the fourth region W4 in which the first insulating layer 16 is formed is, for example, about one third of the width of the first region W1. The third region W3 in which the first insulating layer 16 is not provided is, for example, about one third of the width of the first region W1.

The first insulating layer 16 is formed of, for example, silicon oxide ($SiO_2$), silicon nitride (SiN), silicon oxynitride (SiON), or the like. The first insulating layer 16 is desirably formed of silicon nitride and preferably contains hydrogen.

In the second principle surface 10b, the second stack 13 is formed in the second region W2 in which the first stack 12 is not provided and is formed on the ends in the fourth region W4 in which the first insulating layer 16 is provided. Thus, the ends of the second stack 13 are provided to overlap the first stack 12 in a height direction (z direction).

The second stack 13 is formed of a second i-type layer 13i formed on the second principle surface 10b and a second conductivity type layer 13p formed on the second i-type layer 13i. The second i-type layer 13i is formed of i-type amorphous silicon containing hydrogen and has a thickness of, for example, about several nm to 25 nm.

The second conductivity type layer 13p is formed of an amorphous semiconductor to which a p-type dopant has been added whose conductivity type is different from that of the semiconductor substrate 10. The second conductivity type layer 13p in the present embodiment is formed of p-type amorphous silicon containing hydrogen. The second conductivity type layer 13p has a thickness of, for example, about 2 nm to 50 nm.

The n-side electrode 14, which collects electrons, is formed on the first conductivity type layer 12n. The A-side electrode 15, which collects positive holes, is formed on the second conductivity type layer 13p. A groove is formed between the n-side electrode 14 and the p-side electrode 15, and the electrodes are electrically insulated from each other. In the present embodiment, the n-side electrode 14 and the p-side electrode 15 are formed of a stack of four conductive layers: a first conductive layer 19a through a fourth conductive layer 19d.

The first conductive layer 19a is formed of, for example, a transparent conductive oxide (TCO) such as a stannic oxide ($SnO_2$), a zinc oxide (ZnO), an indium tin oxide (ITO), or the like. In the present embodiment, the first conductive layer 19a is formed of an indium tin oxide and has a thickness of, for example, about 50 nm to 100 nm.

The second conductive layer 19b through the fourth conductive layer 19d are conductive materials that contain metals such as copper (Cu), tin (Sn), gold (Au), silver (Ag) or the like. In the present embodiment, the second conductive layer 19b and the third conductive layer 19c are formed of copper, and the fourth conductive layer 19d is formed of tin. The second conductive layer 19b, the third conductive layer 19c, and the fourth conductive layer 19d have a thickness of about 50 nm to 1000 nm, a thickness of about 10 μm to 20 μm, and a thickness of about 1 μm to 5 μm, respectively.

The method of forming the first conductive layer 19a through the fourth conductive layer 19d is not particularly limited. For example, the layers can be formed by a thin film formation method such as a sputtering method, a chemical vapor deposition method, or the like or by a plating method or the like. In the present embodiment, the first conductive layer 19a and the second conductive layer 19b are formed by a thin film formation method, and the third conductive layer 19c and the fourth conductive layer 19d are formed by a plating method.

The third i-type layer 17i is provided on the first principle surface 10a of the semiconductor substrate 10. The third i-type layer 17i is formed of i-type amorphous silicon containing hydrogen and has a thickness of, for example, about several nm to 25 nm.

On the third i-type layer 17i, the third conductivity type layer 17n is provided. The third conductivity type layer 17n is formed of an amorphous semiconductor to which an n-type dopant has been added whose conductivity type is the same as that of the semiconductor substrate 10. The third conductivity type layer 17n in the present embodiment is formed of n-type amorphous silicon containing hydrogen and has a thickness of, for example, about 2 nm to 50 nm.

On the third conductivity type layer 17n, the second insulating layer 18 functioning as an antireflective film and a protective film is provided. The second insulating layer 18 is formed of, for example, silicon oxide, silicon nitride, silicon oxynitride, or the like. The thickness of the second insulating layer 18 is appropriately set according to antireflection characteristics and the like for serving as an antireflective film and is set to be, for example, about 80 nm to 1000 nm.

A stacked structure of the third i-type layer 17i, the third conductivity type layer 17n, and the second insulating layer 18 may function as a passivation layer of the semiconductor substrate 10.

An explanation will now be given of a method of manufacturing the solar cell 70 according to the present embodiment with reference to FIGS. 3 to 14.

Figure 3:
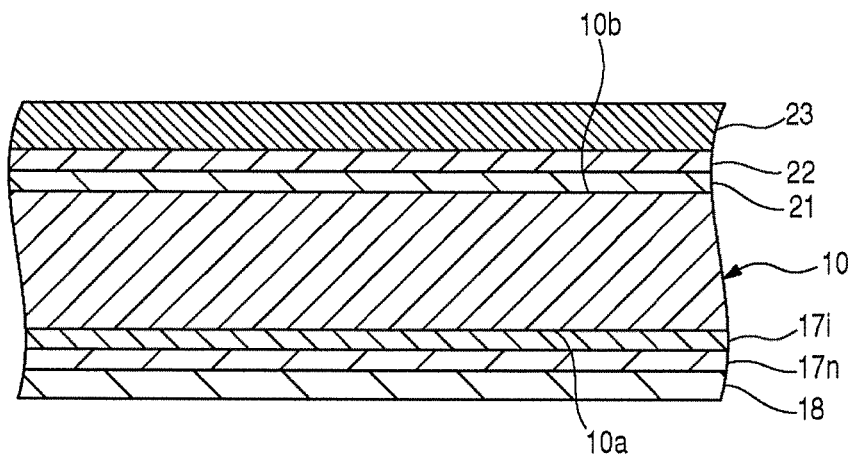
FIG. 3 is a cross-sectional view schematically illustrating a process of manufacturing the solar cell.

As shown in FIG. 3, an i-type amorphous semiconductor layer 21, an n-type amorphous semiconductor layer 22, and an insulating layer 23 are formed on the second principle surface 10b of the semiconductor substrate 10. Further, a third i-type layer 17i, a third conductivity type layer 17n, and a second insulating layer 18 are formed on the first principle surface 10a of the semiconductor substrate 10. A method of forming each of the i-type amorphous semiconductor layer 21, the n-type amorphous semiconductor layer 22, the insulating layer 23, the third i-type layer 17i, the third conductivity type layer 17n, and the second insulating layer 18 is not particularly limited. For example, the layers can be formed by a chemical vapor deposition (CVD) method such as a plasma CVD method or by a sputtering method.

The order of forming each layer on the first principle surface 10a and the second principle surface 10b of the semiconductor substrate 10 can be set appropriately. In the present embodiment, in each process of forming the i-type amorphous semiconductor layer 21, the n-type amorphous semiconductor layer 22, and the insulating layer 23 on the second principle surface 10b, an i-type amorphous semiconductor layer that serves as the third i-type layer 17i, an n-type amorphous semiconductor layer that serves as the third conductivity type layer 17n, and an insulating layer that serves as the second insulating layer 18 are formed.

Figure 4:
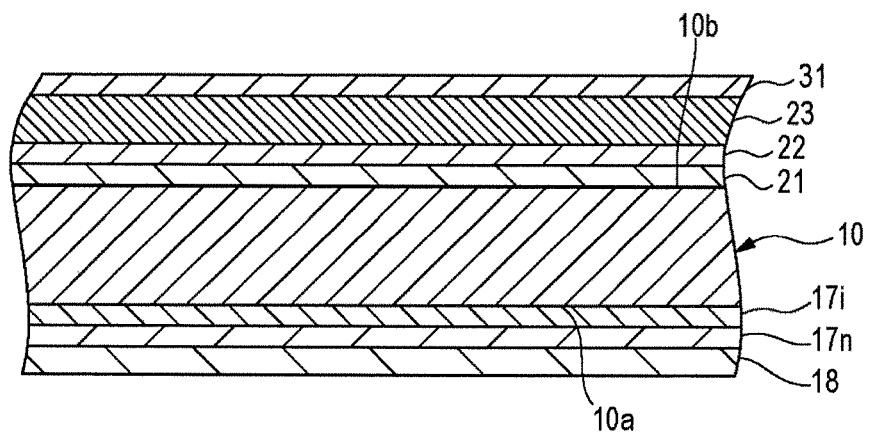
FIG. 4 is a cross-sectional view schematically illustrating the process of manufacturing the solar cell.

Then, as illustrated in FIG. 4, a first mask layer 31 is formed on the insulating layer 23. The first mask layer 31 is a layer that serves as a mask for patterning the i-type amorphous semiconductor layer 21, the n-type amorphous semiconductor layer 22, and the insulating layer 23. The first mask layer 31 is formed of a material that is used for a semiconductor layer or an insulating layer of the solar cell 70 and is formed of a material with alkali resistance that is lower than that of the insulating layer 23. The insulating layer 23 is formed of, for example, a material that includes silicon such as amorphous silicon, silicon nitride with high silicon content, silicon containing oxygen, and silicon containing carbon (C). For the first mask layer 31, amorphous silicon is desirably used, and the first mask layer 31 in the present embodiment is formed of an i-type amorphous silicon layer. The first mask layer 31 is formed to be thin so as to be easily removed in the following laser irradiation process shown in FIG. 5 and has a thickness of, for example, about 2 nm to 50 nm.

Figure 5:
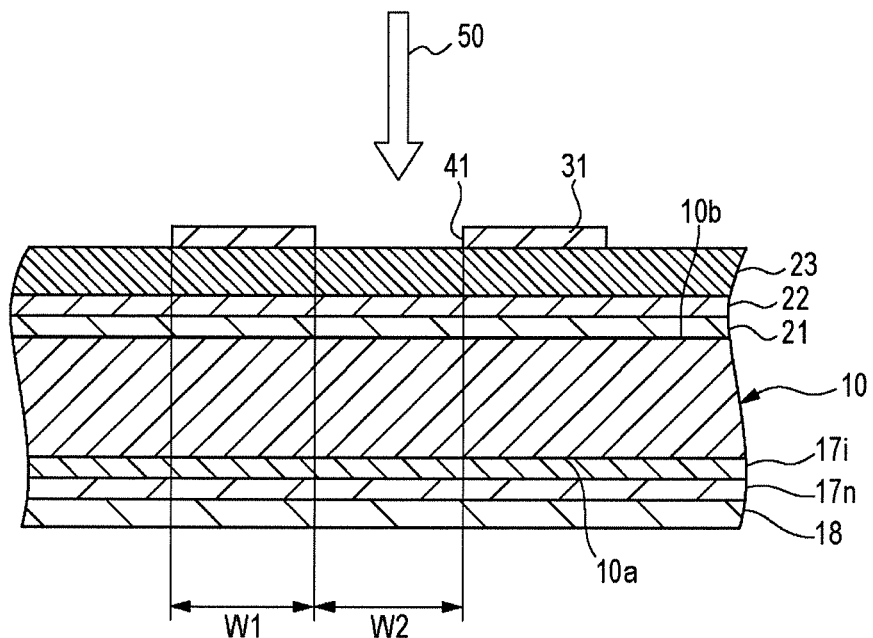
FIG. 5 is a cross-sectional view schematically illustrating the process of manufacturing the solar cell.

Then, as illustrated in FIG. 5, a part of the first mask layer 31 is removed by irradiating the first mask layer 31 with a laser 50. The laser 50 is radiated on the second region W2 in which the second stack 13 is to be provided, and a first opening 41 through which the insulating layer 23 is exposed is formed in the second region W2. The laser 50 is mainly radiated at a strength that allows only the first mask layer 31 to be removed and at a strength that prevents layers below the insulating layer 23 from being exposed at a laser-irradiation part. In order to prevent multiple reflection due to irregularity on the surface of the first mask layer 31, a fluid with a refractive index that is lower than that of the first mask layer 31 or a low refractive-index film such as water and silicon oxide may be provided on the first mask layer 31, and the laser 50 may be then radiated.

Figure 6:
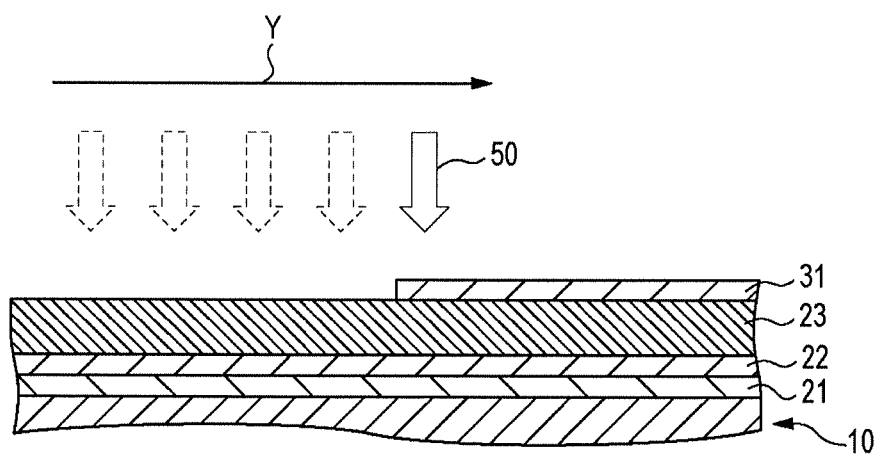
FIG. 6 is a cross-sectional view schematically illustrating the process of manufacturing the solar cell.
Figure 7:
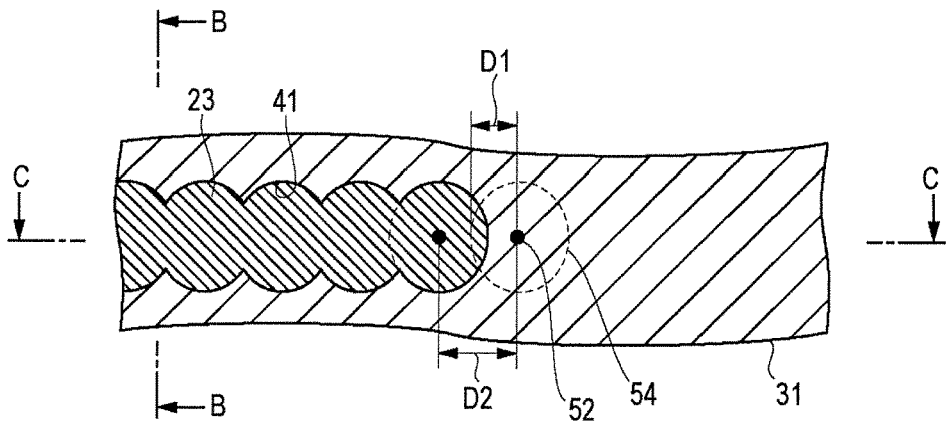
FIG. 7 is a cross-sectional view schematically illustrating the process of manufacturing the solar cell.

FIGS. 6 and 7 are diagrams illustrating a process of forming the first opening 41 by the laser 50. FIG. 6 shows a cross-sectional diagram that is perpendicular to a cross section shown in FIG. 5, and FIG. 7 shows a plan view of the first mask layer 31 seen from above. FIG. 5 corresponds to a B-B line section of FIG. 7, and FIG. 6 corresponds to a C-C line section of FIG. 7. The laser 50 is radiated while the irradiation position is shifted in a Y direction as shown in FIG. 6, and a part of the region of the first mask layer 31 is etched so that the first opening 41 extending in a belt-like shape is formed as shown in FIG. 7.

The laser 50 is radiated such that an irradiation range 54 of the laser 50 barely overlaps with an irradiation range 54 at an adjacent irradiation position, and the laser 50 is radiated while being shifted in such a manner that the center 52 of the laser 50 does not lie in a range where the insulating layer 23 is exposed by the laser irradiation. In other words, the laser 50 is desirably radiated such that an interval D2 between adjacent laser irradiation positions is larger than a radius D1 of the irradiation range 54 in which the first mask layer 31 is removed by the irradiation with the laser 50. By preventing the overlapping of the irradiation ranges 54 of the laser 50 with one another, damage to the semiconductor layer below the insulating layer 23 caused due to laser irradiation is avoided.

The laser 50 is desirably a short pulse laser having a pulse width of about nanoseconds (ns) or picoseconds (ps) so as to reduce the thermal effect on the laser-irradiation part. As such a laser 50, a YAG laser, an excimer laser, or the like may be used. In the present embodiment, the third harmonic (wavelength of 355 nm) of a Nd:YAG laser (wavelength of 1064 nm) is used as a laser source, and the laser 50 is radiated at an intensity of about 0.1 to 0.5 $J/cm^2$ per one pulse. A high-frequency laser source is desirably used in a repetitive manner so that the first opening 41 can be formed in a short time by the laser 50.

Figure 8:
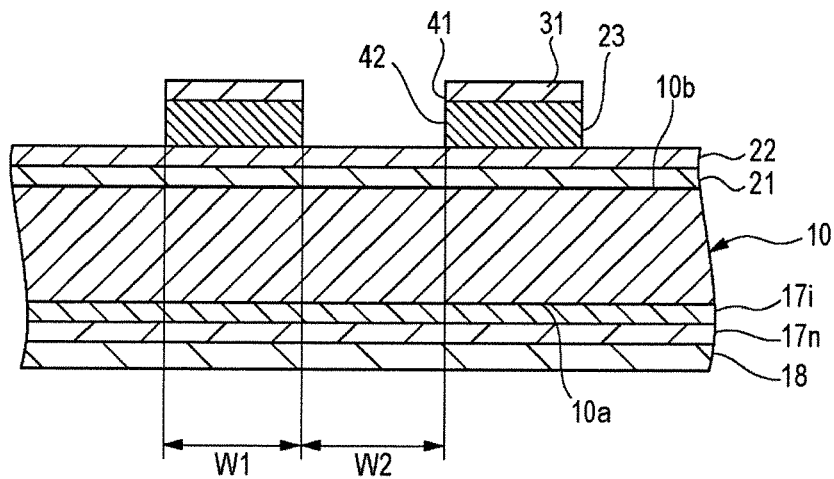
FIG. 8 is a cross-sectional view schematically illustrating the process of manufacturing the solar cell.

Then, as illustrated in FIG. 8, the insulating layer 23 exposed through the first opening 41 is etched using the first mask layer 31 that has been patterned by laser irradiation.

The etching of the insulating layer 23 can be performed using, for example, an acidic etching agent such as a hydrofluoric acid aqueous solution or the like when the insulating layer 23 is formed of silicon oxide, silicon nitride, or silicon oxynitride. The etching agent used for chemical etching may be a fluid or a gas. By the etching of the insulating layer 23 located in the second region W2, a second opening 42 through which the n-type amorphous semiconductor layer 22 is exposed is formed.

Figure 9:
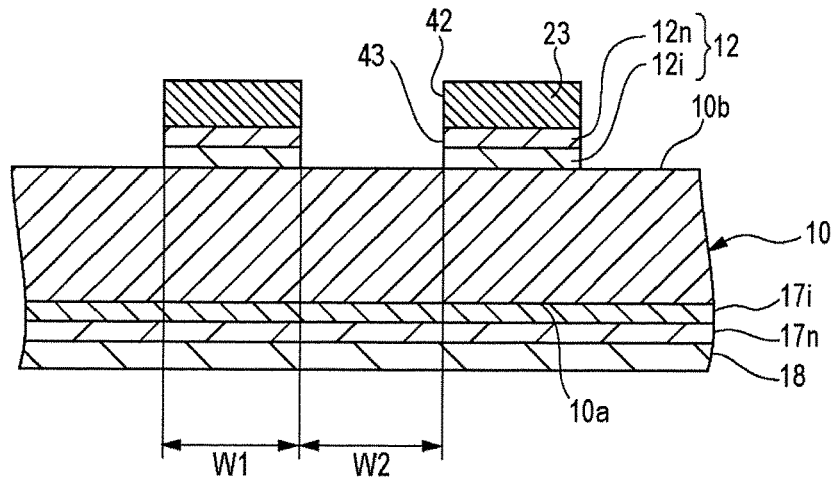
FIG. 9 is a cross-sectional view schematically illustrating the process of manufacturing the solar cell.

Then, as illustrated in FIG. 9, the i-type amorphous semiconductor layer 21 and the n-type amorphous semiconductor layer 22 are etched using the patterned insulating layer 23 as a mask. The i-type amorphous semiconductor layer 21 and the n-type amorphous semiconductor layer 22 are etched using an alkaline etching agent. By removing the i-type amorphous semiconductor layer 21 and the n-type amorphous semiconductor layer 22 located in the second region W2, a third opening 43 through which the second principle surface 10b of the semiconductor substrate 10 is exposed is formed. Further, the first stack 12 is formed by the i-type amorphous semiconductor layer 21 and the n-type amorphous semiconductor layer 22 remaining in the first region W1. The mask layer 31 on the insulating layer 23 is removed at the same time in the process of etching the i-type amorphous semiconductor layer 21 and the n-type amorphous semiconductor layer 22. The second opening 42 and the third opening 43 that are formed after the etching process form an integral groove whose bottom is the second principle surface 10b of the semiconductor substrate 10. The first mask layer 31 may be removed in a process different from the etching of the i-type amorphous semiconductor layer 21 and the n-type amorphous semiconductor layer 22.

Figure 10:
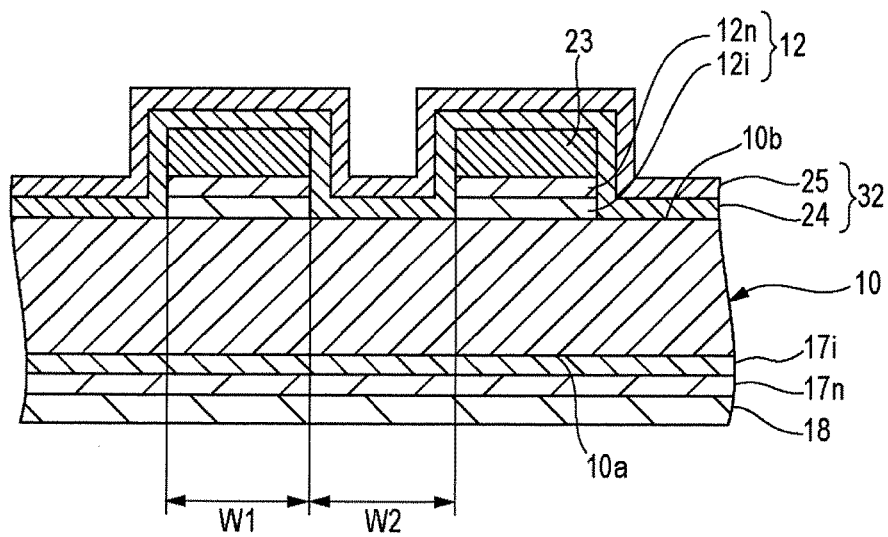
FIG. 10 is a cross-sectional view schematically illustrating the process of manufacturing the solar cell.

As illustrated in FIG. 10, an i-type amorphous semiconductor layer 24 is then formed to cover the second principle surface 10b and the insulating layer 23, and a p-type amorphous semiconductor layer 25 is formed on the i-type amorphous semiconductor layer 24. A method of forming the i-type amorphous semiconductor layer 24 and the p-type amorphous semiconductor layer 25 is not particularly limited. For example, the layers can be formed by a thin film formation method such as a CVD method, or the like. The i-type amorphous semiconductor layer 24 and the p-type amorphous semiconductor layer 25 function as a second mask layer 32 for further patterning of the insulating layer 23.

Figure 11:
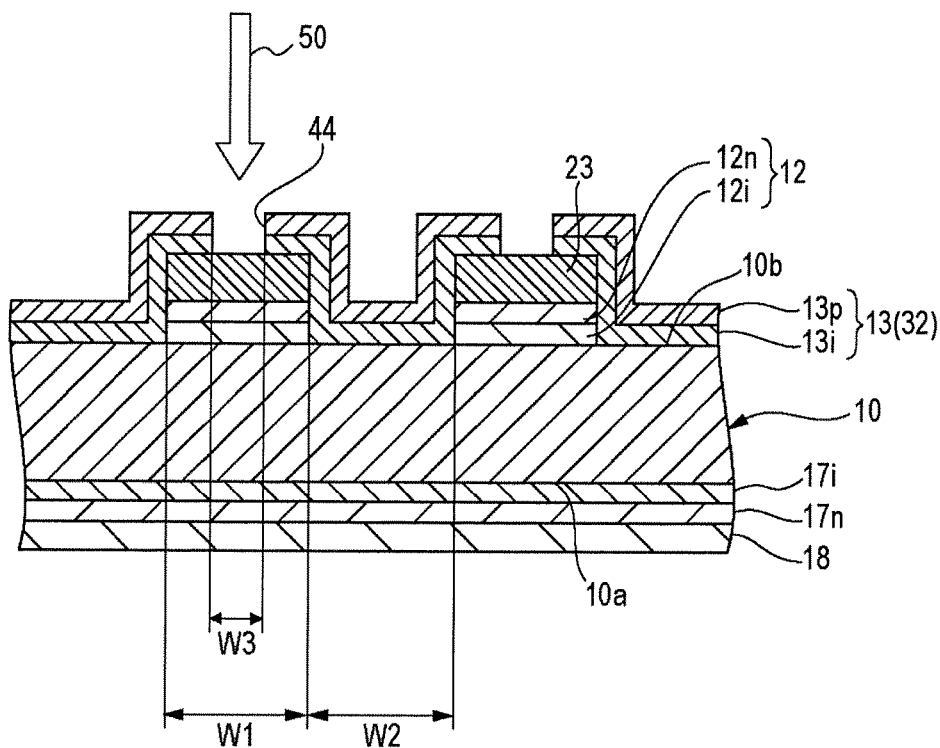
FIG. 11 is a cross-sectional view schematically illustrating the process of manufacturing the solar cell.

Then, as illustrated in FIG. 11, the laser 50 is radiated on a part of the second mask layer 32 located on the insulating layer 23 in the first region W1. In the third region W3 irradiated with the laser 50, a fourth opening 44 is formed through which the insulating layer 23 is exposed. A part of the second mask layer 32 other than the part in the third region W3 is left by the laser irradiation, and the i-type amorphous semiconductor layer 24 and the p-type amorphous semiconductor layer 25 form the second i-type layer 13i and the second conductivity type layer 13p, respectively. In other words, the second stack 13 is formed by the second mask layer 32.

Figure 12:
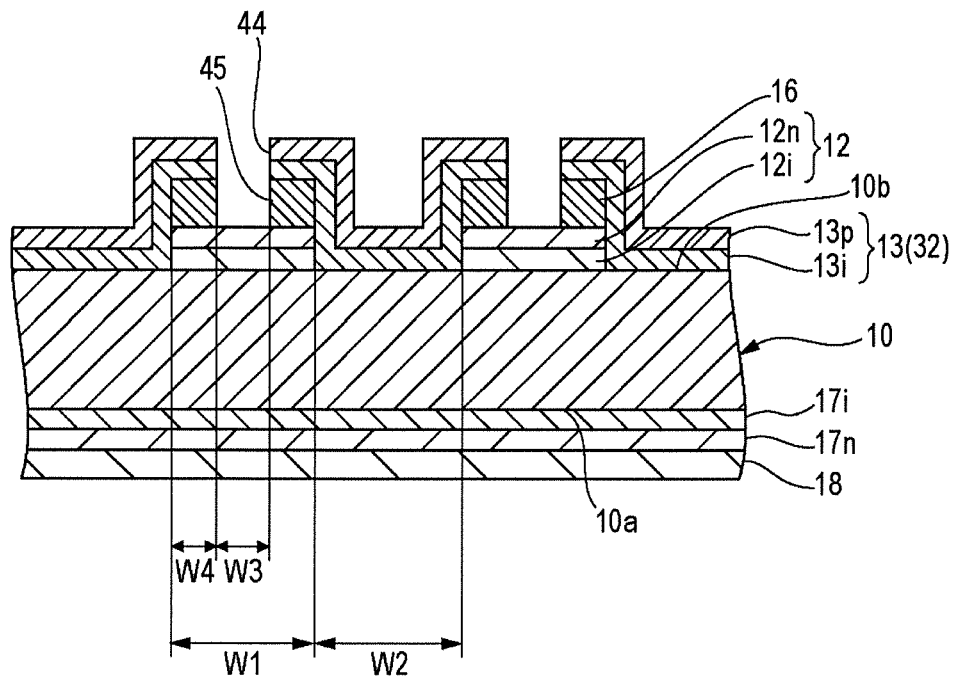
FIG. 12 is a cross-sectional view schematically illustrating the process of manufacturing the solar cell.

Then, as illustrated in FIG. 12, the insulating layer 23 exposed through the fourth opening 44 is etched using the second mask layer 32 that has been patterned. In the same way as in the above-described process shown in FIG. 8, the etching of the insulating layer 23 can be performed using an acidic etching agent such as a hydrofluoric acid aqueous solution or the like. Thereby, a first conductivity type layer 12n is exposed by forming a fifth opening 45 in the insulating layer 23, and a second insulating layer 18 is formed from the insulating layer 23. A region in which the insulating layer 23 is removed forms a third region W3, and a region in which the second insulating layer 18 remains forms a fourth region W4. The fourth opening 44 and the fifth opening 45 that are formed after the etching process form an integral groove whose bottom is the surface of the first conductivity type layer 12n.

Figure 13:
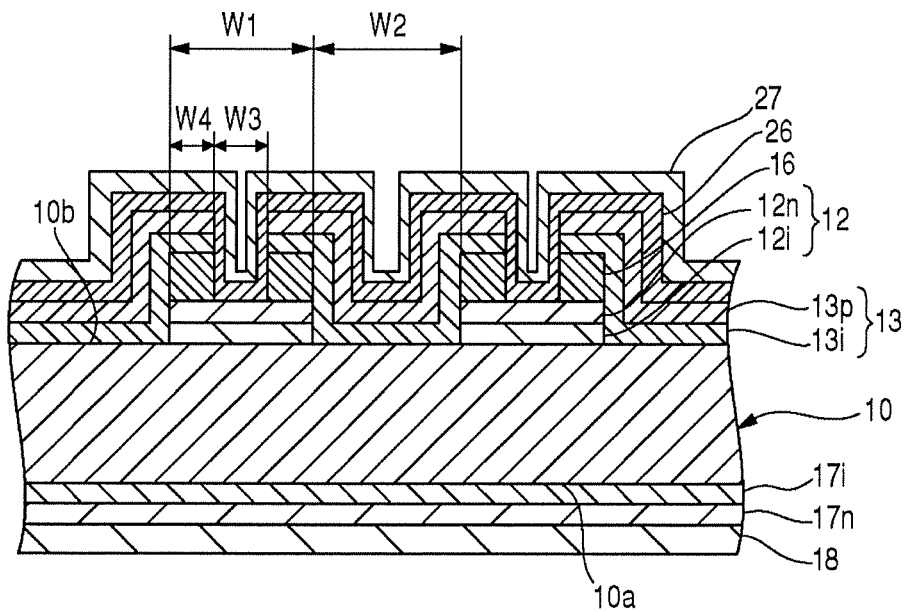
FIG. 13 is a cross-sectional view schematically illustrating the process of manufacturing the solar cell.

Then, as illustrated in FIG. 13, conductive layers 26 and 27 are formed on the first conductivity type layer 12n and the second conductivity type layer 13p. The conductive layer 26 is a transparent electrode layer of an indium tin oxide (ITO) or the like, and the conductive layer 27 is a metal electrode layer formed of a metal such as copper (Cu) or an alloy. The conductive layers 26 and 27 are formed by a CVD method such as a plasma CVD method or a thin film formation method such as a sputtering method.

Figure 14:
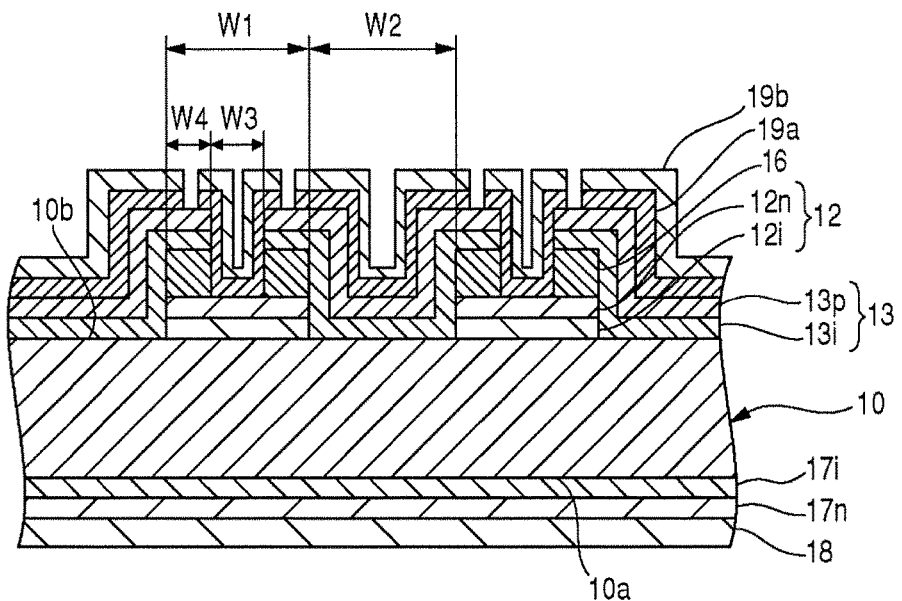
FIG. 14 is a cross-sectional view schematically illustrating the process of manufacturing the solar cell.

As illustrated in FIG. 14, a portion of the conductive layer 26 and a portion of the conductive layer 27 that are located above the second insulating layer 18 are then divided so as to form a groove. Thereby, a first conductive layer 19a and a second conductive layer 19b are formed from the conductive layers 26 and 27, respectively, and an n-type electrode and a p-side electrode are separated. The division of the conductive layers 26 and 27 can be performed by, for example, wet etching or laser irradiation.

At last, a third conductive layer 19c containing copper (Cu) and a fourth conductive layer 19d containing tin (Sn) are formed on the first conductive layer 19a and the second conductive layer 19b by a plating method.

By the above manufacturing processes, the solar cell 70 shown in FIG. 2 can be completed.

According to the present embodiment, since a mask layer is patterned by laser irradiation, photolithography processes for patterning can be reduced. In general, photolithography processes where resists are used require a process of forming resist films, a process of curing the resist films by light irradiation, a process of removing uncured resist films, a process of removing resist films after patterning, etc., and the running costs are thus high. In the present embodiment, since a material that contains silicon is used for mask layers, the mask layers can be formed without using an expensive photoresist and can be formed by processes that are the same as those used when forming other semiconductor layers and insulating layers. This allows the cost for manufacturing the solar cell 70 to be reduced. Also, by reducing the usage of a photoresist, environmental burdens in the process of manufacturing the solar cell 70 can be reduced.

Also, according to the present embodiment, a precipitous end surface can be formed at an opening since etching by laser irradiation and etching by an etching agent are combined. In forming a deep opening by laser irradiation, it is difficult to form an end surface that is almost perpendicular to a principle surface of the semiconductor substrate 10. In removing, by a laser, the i-type amorphous semiconductor layer 21 and the n-type amorphous semiconductor layer 22 formed thinly on the semiconductor substrate 10, there is a possibility that these layers come off near the openings and/or become damaged by the thermal effect due to laser irradiation. On the other hand, according to the present embodiment, since the i-type amorphous semiconductor layer 21, the n-type amorphous semiconductor layer 22, and the insulating layer 23 are etched by an etching agent, an end surface can be formed that is more precipitous than that in the case where only a laser is used, and the peeling of the semiconductor layers at an interface can be prevented. Also, damage to the interface of the second principle surface 10b due to laser irradiation that leads to a decrease in the efficiency of the generation of electricity can be prevented.

Further, according to the present embodiment, since the i-type amorphous semiconductor layer 24 and the p-type amorphous semiconductor layer 25 are used as the second mask layer 32, patterning can be realized without providing another mask layer that is unnecessary for the structure of the solar cell 70. Also, since the removal of the p-type amorphous semiconductor layer 25 by an etching agent is difficult compared to other layers, the patterning of the p-type amorphous semiconductor layer 25 can be easily achieved by use of laser irradiation. This allows the cost for manufacturing the solar cell 70 to be reduced.

Also, by providing a fluid with a low refractive index or a low refractive-index film on a mask layer at the time of laser irradiation, multiple reflection due to irregularity on the mask layer that result in unevenness in the amount of etching performed by laser irradiation can be prevented. Also, by providing a fluid or a low refractive-index film on a mask layer at the time of laser irradiation, attachment of debris or the like produced from the mask layer by the laser irradiation to another semiconductor layer can be prevented.

Also, by combining etching by laser irradiation and etching by an etching agent, the thickness of the insulating layer 23 provided between the first stack 12 and the second stack 13 can be reduced. Further, by reducing the thickness of the insulating layer 23 below the mask layer irradiated with the laser 50, a partial increase in light intensity caused by the reflection of the laser 50 at the interface of the insulating layer 23 can be prevented. Thereby, damage by laser irradiation to a semiconductor layer or an insulating layer other than the mask layer can be prevented, and a decrease in the output characteristics of the solar cell 70 can be prevented.

An embodiment of the present invention relates to a method of manufacturing the solar cell 70. This method includes: providing the insulating layer 23 on a semiconductor layer (an n-type amorphous semiconductor layer 22) provided on at least a part of a principle surface (a second principle surface 10b) of the semiconductor substrate 10; providing a mask layer (a first mask layer 31 or a second mask layer 32) on the insulating layer 23; removing a part of the mask layer (the first mask layer 31 or the second mask layer 32) by laser irradiation so as to form a first opening (a first opening 41 or a fourth opening 44) through which the insulating layer 23 is exposed; and removing, by an etching agent, the insulating layer 23 exposed through the first opening (the first opening 41 or the fourth opening 44) so as to form a second opening (a second opening 42 or a fifth opening 45) through which the semiconductor layer (the n-type amorphous semiconductor layer 22) is exposed.

The mask layer (the first mask layer 31 or the second mask layer 32) may be formed of a material containing silicon.

The method may further include: providing, on the mask layer (the first mask layer 31 or the second mask layer 32), a fluid with a refractive index that is lower than that of the mask layer or a low refractive-index film, and laser irradiation may be performed over the fluid or the low refractive-index film.

The semiconductor layer (the n-type amorphous semiconductor layer 22) may be formed of an n-type semiconductor material containing silicon, and the mask layer (the second mask layer 32) may be formed of a p-type semiconductor material containing silicon.

The method may further include: forming an n-side electrode 14 electrically connected to the semiconductor layer (the n-type amorphous semiconductor layer 22) exposed through the second opening (the fifth opening 45) and a p-side electrode 15 electrically connected to the mask layer (the second mask layer 32).

The method may further include: removing, by an etching agent, the semiconductor layer (the n-type amorphous semiconductor layer 22) exposed through the second opening 42 so as to form a third opening 43 through which the semiconductor substrate 10 is exposed.

The method, wherein the mask layer is the first mask layer 31, may further include: removing the first mask layer 31 by the etching agent so as to expose the top of the insulating layer 23; providing the second mask layer 32 on the semiconductor substrate 10 exposed through the third opening 43 and on the insulating layer 23; removing a part of the second mask layer 32 located on the insulating layer 23 by laser irradiation so as to form a fourth opening 44 through which the insulating layer 23 is exposed; and removing, by the etching agent, the insulating layer 23 exposed through the fourth opening 44 so as to form a fifth opening 45 through which the semiconductor layer (the n-type amorphous semiconductor layer 22) is exposed.

The method, wherein the semiconductor layer (the n-type amorphous semiconductor layer 22) is formed of an n-type semiconductor material containing silicon and the second mask layer 32 is formed of a p-type semiconductor material containing silicon, may further include: forming the n-side electrode 14 electrically connected to the semiconductor layer (the n-type amorphous semiconductor layer 22) exposed through the fifth opening 45 and a p-side electrode 15 electrically connected to the second mask layer.

The present invention has been described by referring to each of the above-described embodiment. However, the present invention is not limited to the above-described embodiment only, and those resulting from any combination of them as appropriate or substitution are also within the scope of the present invention.

In the above-described embodiment, a mask layer that has been patterned by the irradiation with the laser 50 is used in both the process of removing the insulating layer 23 located in the second region W2 and the process of removing the insulating layer 23 located in the third region W3. In an exemplary variation, a mask layer that has been patterned by laser irradiation may be used in either one of the processes, and a resist that has been patterned by photolithography or the like may be used in the other process.

It should be understood that the invention is not limited to the above-described embodiments and modifications, but may be further modified into various forms on the basis of the spirit of the invention. Additionally, those modifications are included in the scope of the invention.

What is claimed is:
1. A method of manufacturing a solar cell comprising:
providing an insulating layer on a semiconductor layer provided on at least a part of a principle surface of a semiconductor substrate;
providing a first mask layer on the insulating layer;
removing a part of the first mask layer by a first laser irradiation so as to form a first opening;
removing, by a first etching agent, the insulating layer exposed through the first opening so as to form a second opening through which the semiconductor layer is exposed;
removing, by a second etching agent, the semiconductor layer exposed through the second opening so as to form a third opening through which the semiconductor substrate is exposed;
removing the first mask layer by a third etching agent;

providing a second mask layer on the semiconductor substrate exposed through the third opening and on the insulating layer;

removing a part of the second mask layer located on the insulating layer by a second laser irradiation so as to form a fourth opening through which the insulating layer is exposed; and removing, by a fourth etching agent, the insulating layer exposed through the fourth opening so as to form a fifth opening through which the semiconductor layer is exposed.

2. The method of manufacturing the solar cell according to claim 1, wherein the first mask layer is formed of a material containing silicon.

3. The method of manufacturing the solar cell according to claim 1, further comprising:

providing, on the first mask layer, a fluid with a refractive index that is lower than that of the mask layer or a low refractive-index film, wherein the first laser irradiation is performed over the fluid or the low refractive-index film.

4. The method of manufacturing the solar cell according to claim 1, wherein the semiconductor layer is formed of an n-type semiconductor material containing silicon and the second mask layer is formed of a p-type semiconductor material containing silicon.

5. The method of manufacturing the solar cell according to claim 4, further comprising:

forming an n-side electrode to be electrically connected to the semiconductor layer exposed through the second opening and a p-side electrode to be electrically connected to the second mask layer.

6. The method of manufacturing the solar cell according to claim wherein the semiconductor layer is formed of an n-type semiconductor material containing silicon and the second mask layer is formed of a p-type semiconductor material containing silicon, the method further comprising:

forming an n-side electrode to be electrically connected to the semiconductor layer exposed through the fifth opening and a p-side electrode to be electrically connected to the second mask layer.

7. The method of manufacturing the solar cell according to claim 1, wherein:

the first opening comprises a first irradiated area formed by the first laser irradiation and a second irradiated area formed by the second laser irradiation, which are arranged in line along the principle surface of a semiconductor substrate, and a distance between a center of the first irradiated area and a center of the second irradiated area is larger than a radius of the first irradiated area.

8. A method of manufacturing a solar cell comprising:

providing an insulating layer on a semiconductor layer provided on at least a part of a principle surface of a semiconductor substrate, wherein the semiconductor layer is in direct contact with the semiconductor substrate;

providing a first mask layer on the insulating layer;

removing a part of the first mask layer by a first laser irradiation so as to form a first opening;

removing the insulating layer exposed through the first opening so as to form a second opening through which the semiconductor layer is exposed;

removing, by an etching agent, the semiconductor layer exposed through the second opening so as to form a third opening;

removing the first mask layer; and providing a second mask layer on the semiconductor substrate exposed through the third opening and on the insulating layer.

9. The method of manufacturing the solar cell according to claim 8, wherein the first mask layer is formed of a material containing silicon.

10. The method of manufacturing the solar cell according to claim 8, further comprising:

providing, on the first mask layer, a fluid with a refractive index that is lower than that of the mask layer or a low refractive-index film, wherein the first laser irradiation is performed over the fluid or the low refractive-index film.

11. The method of manufacturing the solar cell according to claim 8, wherein the semiconductor layer is formed of an n-type semiconductor material containing silicon and the second mask layer is formed of a p-type semiconductor material containing silicon.

12. The method of manufacturing the solar cell according to claim 8, comprising:

removing a part of the second mask layer located on the insulating layer by a second laser irradiation so as to form a fourth opening through which the insulating layer is exposed; and removing, by an etching agent, the insulating layer exposed through the fourth opening so as to form a fifth opening through which the semiconductor layer is exposed.

13. The method of manufacturing the solar cell according to claim 12, wherein the semiconductor layer is formed of an n-type semiconductor material containing silicon and the second mask layer is formed of a p-type semiconductor material containing silicon, and the method further comprises:

forming an n-side electrode to be electrically connected to the semiconductor layer exposed through the fifth opening and a p-side electrode to be electrically connected to the second mask layer.

14. The method of manufacturing the solar cell according to claim 8, wherein the first opening comprises a first irradiated area formed by the first laser irradiation and a second irradiated area formed by the second laser irradiation, which are arranged in line along the principle surface of a semiconductor substrate, and a distance between a center of the first irradiated area and center of the second irradiated area is larger than a radius of the first irradiated area.

15. A method of manufacturing a solar cell comprising:

providing an insulating layer on a semiconductor layer provided on at least a part of a principle surface of a semiconductor substrate;

providing a mask layer on the insulating layer and on the surface of the semiconductor substrate;

removing a part of the mask layer by laser irradiation so as to form a first opening through which the insulating layer is exposed; and removing the insulating layer exposed through the first opening so as to form a second opening through which the semiconductor layer is exposed, wherein the first opening comprises a first irradiated area formed by a first laser irradiation and a second irradiated area formed by a second laser irradiation, which are arranged in line along the principle surface of a semiconductor substrate, and a distance between a center of the first irradiated area and a center of the second irradiated area is larger than a radius of the first irradiated area.

16. The method of manufacturing the solar cell according to claim 15, wherein the mask layer is formed of a material containing silicon.

17. The method of manufacturing the solar cell according to claim 15, wherein the semiconductor layer is formed of an n-type semiconductor material containing silicon and the mask layer is formed of a p-type semiconductor material containing silicon.

* * * * *